(12) United States Patent
Care (10) Patent No.: US 8,552,931 B2
(45) Date of Patent: Oct. 8, 2013

(54) SENSOR ARRANGEMENT

(75) Inventor: Ian C. D. Care, Derby (GB)

(73) Assignee: Rolls-Royce PLC, London (GB)

( * ) Notice: Subject to any disclaimer, the term of this patent is extended or adjusted under 35 U.S.C. 154(b) by 708 days.

(21) Appl. No.: 12/747,214

(22) PCT Filed: Nov. 18, 2008

(86) PCT No.: PCT/GB2008/003878
§ 371 (c)(1),
(2), (4) Date: Jun. 10, 2010

(87) PCT Pub. No.: WO2009/077712
PCT Pub. Date: Jun. 25, 2009

(65) Prior Publication Data
US 2010/0271291 A1    Oct. 28, 2010

(30) Foreign Application Priority Data
Dec. 14, 2007  (GB) .................................. 0724339.7

(51) Int. Cl.
G09G 3/20        (2006.01)
(52) U.S. Cl.
USPC ............................................. 345/58; 345/55
(58) Field of Classification Search
USPC ................. 345/58, 85, 1.1, 53, 55, 170–181; 178/18.01–18.06; 324/72, 109, 428, 452, 324/457; 340/561, 854.8; 257/53, 57, 60, 257/432
See application file for complete search history.

(56) References Cited

U.S. PATENT DOCUMENTS

| 4,255,754 | A | * | 3/1981 | Crean et al. ..................... 347/81 |
| 4,614,908 | A |   | 9/1986 | Daniele et al. |
| 4,998,103 | A | * | 3/1991 | Rosswurm et al. ...... 340/870.37 |
| 5,534,859 | A | * | 7/1996 | Meyer ....................... 340/870.37 |
| 5,914,610 | A | * | 6/1999 | Gershenfeld et al. ......... 324/663 |
| 6,066,954 | A | * | 5/2000 | Gershenfeld et al. ......... 324/671 |
| 6,075,520 | A | * | 6/2000 | Inoue et al. .................... 345/173 |

(Continued)

FOREIGN PATENT DOCUMENTS

| EP | 1 055 833 A2 | 11/2000 |
| EP | 1 959 264 A1 | 8/2008 |

(Continued)

OTHER PUBLICATIONS

Osamu Fujiwara, "A Measurement Method for Visualization of Static Electricity Distribution", Electronics & Communications in Japan Part II—Electronics, Oct. 1, 1989, pp. 96-103, vol. 72, Wiley, Hoboken, NJ.

(Continued)

*Primary Examiner* — Prabodh M Dharia
(74) *Attorney, Agent, or Firm* — Oliff & Berridge, PLC (57) ABSTRACT

A sensor is provided having an array of electrostatic sensor elements with each sensor element being capable of producing a respective output signal when the sensor is directed to a region of an object being sensed, the output signals being separately available at the sensor output to provide information relating to the electrostatic charge distribution across the region, and the sensor being configured such that at least two electrostatic sensor element are interlinked by means of a differential input charge amplifier, each input to the differential input charge amplifier includes a decoupling device, and the differential input charge amplifier is associated with an integrating or augmenting amplifier to further condition the image signal presented to the controller.

17 Claims, 8 Drawing Sheets

(56) References Cited

U.S. PATENT DOCUMENTS

| | | | |
|---|---|---|---|
| 6,400,359 B1* | 6/2002 | Katabami | 345/173 |
| 6,922,059 B2* | 7/2005 | Zank et al. | 324/457 |
| 7,161,486 B2* | 1/2007 | Care | 340/561 |
| 8,203,343 B1* | 6/2012 | Olsson et al. | 324/326 |
| 8,339,140 B2* | 12/2012 | Care | 324/457 |
| 2001/0030324 A1* | 10/2001 | Morikawa et al. | 257/59 |
| 2002/0067344 A1* | 6/2002 | Chiu | 345/173 |
| 2005/0122118 A1* | 6/2005 | Zank et al. | 324/457 |
| 2005/0248335 A1* | 11/2005 | Care | 324/109 |
| 2006/0192565 A1 | 8/2006 | Yasuda et al. | |
| 2006/0261818 A1 | 11/2006 | Zank et al. | |
| 2008/0079444 A1* | 4/2008 | Denison | 324/679 |

FOREIGN PATENT DOCUMENTS

| | | |
|---|---|---|
| GB | 2 353 594 A | 2/2001 |
| JP | A-3-163971 | 7/1991 |
| JP | A-6-197192 | 7/1994 |
| WO | WO 2004/065971 A1 | 8/2004 |
| WO | WO 2007/071630 A1 | 6/2007 |

OTHER PUBLICATIONS

Search Report issued Feb. 17, 2009 in International Application No. PCT/GB2008/003878.

Written Opinion issued Feb. 17, 2009 in International Application No. PCT/GB2008/003878.

Search Report issued Mar. 12, 2008 in United Kingdom Application No. GB0724339.7.

* cited by examiner

SENSOR ARRANGEMENT

The present invention relates to a sensor arrangement and more particularly to sensor arrangements utilised for sensing electrostatic charge variations in order to provide an image for analysis and interpretation.

It is known to utilise electrostatic charge as determined by electrostatic sensor elements in an array in order to provide an image of an object. Such electrostatic charge imaging has been utilised with respect to monitoring bearings to determine wear characteristics. Such electrostatic charge distribution imaging can also be utilised in relation to blood flow and in particular certain blood flows which are indicative of skin abnormalities such as melanoma in an animal such as a human.

Previous patent EP1590676 illustrates use of multiple electrostatic sensor elements in an array such that signals from these respective sensor elements can be processed to provide an image of the electrostatic topology of an object. Such images as indicated are useful in a number of areas.

The problem to be solved relates to an ability to measure the distribution and preferably charge generation and to locate reasonably accurately the location of these charges. If measurement equipment is located too close to the charge source it distorts the measurement in accordance with an effective inverse square law and if measured from too far away, the resolution of the measurement capability for location is less accurate.

Where defects are to be located, for instance in the skin of a patient, the extent of the defect needs to be known accurately so that all the infected or other deleterious tissue is removed but without removing perfectly good tissue. In such circumstances the best possible patient outcomes with the least cosmetic effect are then achieved given that many of these skin features are on parts of the body exposed to the sun and therefore are visible. It will be appreciated that patients are generally sensitive to any cosmetic effects and scarring as a result of tissue removal.

Unfortunately the accuracy of measurements can be changed by local sources of charge not associated with the object being measured. Such local sources of charge may be another object moving in the locality of the sensor during imaging procedures. One approach is to introduce a charge to the object to be measured that is greater than the noise charge. In such circumstances when measurements are taken and the distribution of generation monitored to provide the image, the overall results will mask the lower locally produced charge. With respect to patient investigations it will be understood that there is a limitation to the amount of charge that can be induced. Thus some other form of avoiding extraneous noise distorting results must be devised.

In accordance with aspects of the present invention, there is provided a sensor comprising an array of electrostatic sensor elements, each sensor element capable of producing a respective output signal when the sensor is directed to a region of an object being sensed, the output signals being separately available at the sensor output to provide information relating to the electrostatic charge distribution across the regions the sensor characterised in that at least one electrostatic sensor element interlinked with a differential input charge amplifier with other electrostatic sensor elements, an input to the differential input charge amplifier includes a decoupling device, the at least one electrostatic sensor element having a depth to surface width aspect ratio greater than 1:10 chosen to act in co-operation with the decoupling device to reduce inter-sensor element noise.

Typically, the decoupling device is a capacitor or a resistor or resistor-capacitor divider or inductive-capacitor divider. Generally, the decoupling device will have a high voltage capacity and be electrically stable. Typically, the decoupling device will be formed from a ceramic or Mica. Possibly, where the decoupling device is a capacitor the capacitor will have a value in the range of 1 pF to 1 µF. Generally, the specification of the decoupling device will be determined at least in part by the relative position of the sensor to the differential input charge amplifier. Possibly, the value of the decoupling device will be determined by trace inductance and signal frequency of the respective electrostatic sensor elements in the sensor.

Generally, each electrostatic sensor element is presented upon a substrate to prevent capacitive coupling between sensor elements in the array.

Possibly, the substrate is formed from glass reinforced plastic (GRP). Typically, the one electrostatic sensor element is presented on one side of the substrate and electrical connections pass through the substrate to the other side, the other side has an electrically grounded surface to prevent capacitive coupling.

Alternatively, the substrate has a cellular construction with each electrostatic sensor element in a cell and an electrically grounded shield provided between each adjacent cell to inhibit electrical coupling.

Also in accordance with aspects of the present invention, there is provided a sensor arrangement comprising a sensor as described above along with a display and controller, the sensor providing image signals to the controller for each electrostatic sensor element, the controller consolidating the image signals to provide a display signal to the display.

Possibly, the controller incorporates a means for dither manipulation of the image signals providing estimation for pixels between electrostatic sensor element positions and so by a trend fit and smoothing technique enhance the display signal presented to the display.

Possibly the sensor arrangement incorporates a switch for the one electrostatic sensor element to allow the differential input charge amplifier to be switched into association with the sensor electively. Possibly, the switch allows the one electrostatic sensor element to be switched between the differential input charge amplifier and the decoupling device and another amplifier. Possibly, the switch is an electronic switch. Possibly, the switch is operated by a timing device associated within the controller to switch operation of the electrostatic sensor element dependent upon provision of a necessary display signal to the display.

Possibly, the differential input charge amplifier is associated with an integrating or augmenting amplifier to further condition the image signal presented to the controller. Possibly, the integrating or augmenting amplifier allows scaling of the image signal. Possibly, the augmenting amplifier is utilised to allow output from the one electrostatic sensor element to be integrated over time.

Possibly, the sensor arrangement incorporates a cascade of amplifiers and/or signal filters after the differential input charge amplifier in order to condition and present the image signal to the controller.

Embodiments of aspects of the present invention will now be described by way of example and with reference to the accompanying drawings in which.

As indicated above electrical noise and cross-talk that is in common mode is problematical as the effects upon output signals of sensors can produce output signals within which it is difficult to see variations. Where the electrical noise is variable, it is difficult to get a reliable result and therefore accuracy in an image formed by electrostatic charge distribution. Typically, in order to reduce noise, there is a tendency to move a sensor as close to an object being examined as possible or to shield the sensor in order to provide a very narrow view which then reduces signal to noise levels such that internal noise generated by the electronics becomes more significant. Where the object being measured is a human patient and the feature on the person may be sensitive, it is preferable to measure from a distance that is not likely to hurt or distress the person.

Figure 1:
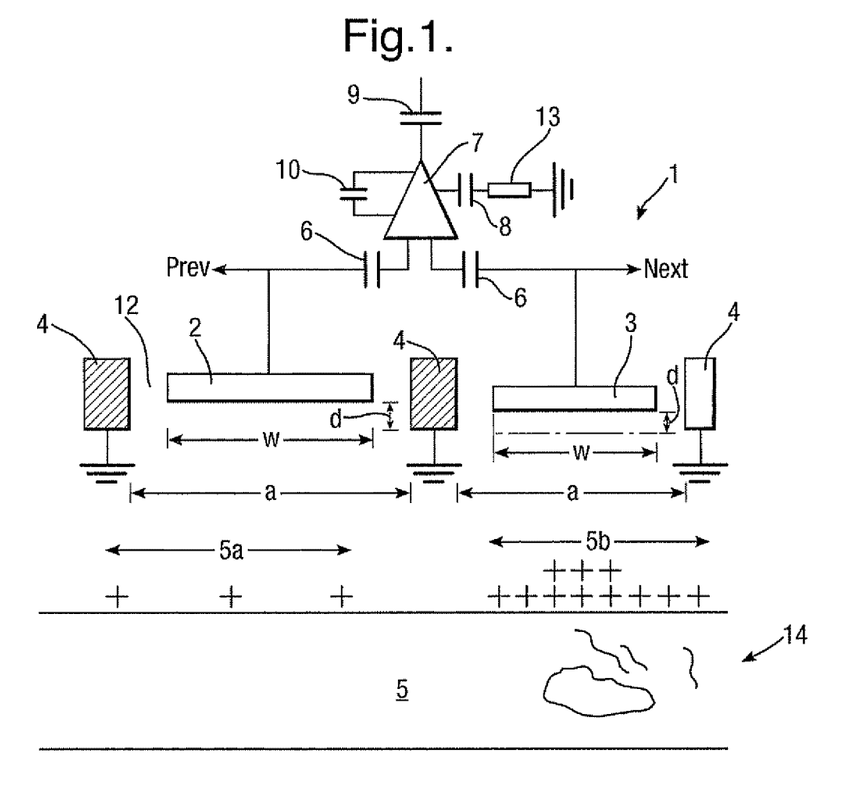
FIG. 1 is a schematic illustration of an electrostatic sensor element array in a sensor in accordance with aspects of the present invention.

In the above circumstances an approach is required which can achieve improved results without additional requirements for shielding and earthing between electrostatic sensor elements. FIG. 1 provides a schematic illustration of two electrostatic sensor elements 2, 3 in parts of an array 1. Electrical shielding is provided by shields 4, (typically connected to earth) between sensor elements 2, 3. Isolation is provided by air, vacuum or inert (non conductive) material. In use, the sensor elements 2, 3 provide electrostatic charge responses dependent upon the viewed areas of a subject 5. Thus, the electrical shielding 4 acts to narrow and avoid cross talk or noise between the elements 2, 3 such that the element 2 provides a response indicative of an area 5$a$, whilst the sensor element 3 provides a response indicative of area 5$b$ of the subject 5. As indicated above use of the shielding 4 reduces direct cross-talk but there are still potential problems with respect to electronic noise. In a practical sensor an array comprises a relatively large number of sensor elements will be used.

The sensor is detecting the surface charge 5$b$, which may be generated sub-surface by a defect 14, which may not be optically visible on the surface. This may be for instance on animal (human) skin or a mechanical component such as a fiber resin composite (eg GRP or CFRP) where the charge is generated due to tribological effects within the materials along the lines of delamination.

In accordance with aspects of the present invention, and as a basic array building block within the sensor, there is provided a structure comprising a plurality of electrostatic sensor elements with a differential input charge amplifier provided between respective adjacent sensor elements. When the differential input charge amplifier acts as a link in a matrix between the adjoining and adjacent sensor elements in accordance with aspects of the present invention a decoupling device is utilised in the input at least to avoid cross talk between the electric circuits for the respective sensor elements.

The decoupling devices need to be small, although they will have a high voltage capacity and be stable to avoid becoming themselves a source of electrical noise. Typically the decoupling devices may comprise capacitors or resistors or a resistor and capacitor divider or an inductor and capacitor divider. The embodiment described below will be with regard to utilisation of a capacitor as a decoupling device. Generally the decoupling capacitor is formed from a ceramic or Mica type structure with typical values in the order of 1 pF to 1 μF. The actual value or specification determined for the decoupling device will be dependent upon the relative position of the differential input charge amplifier and any trace electrical inductors and signal frequency determined by the sensor elements 2, 3. It will be appreciated the technique of sharing charge using decoupling or splitter capacitors is relatively well known and acts to improve isolation of the sensor elements. Aspects of the present invention combine this decoupling device with achieving configurational depth for the sensor elements. For clarity the decoupling devices are shown only in FIGS. 1 and 8.

In accordance with aspects of the present invention a sensor element is arranged such that the sensor depth d is very shallow compared to the sensor face width w. Generally the ratio is preferably at least better than 1:10 in terms of an aspect ratio between depth and width. Furthermore, again to reduce electrical capacitive coupling between the sensor elements 2, 3 the substrate itself is configured to avoid such coupling.

In one embodiment the sensor elements 2, 3 are formed on a glass fiber reinforced plastic (GRP) or the substrate can be any conventional electronic circuit substrate including paper, wood, plastic etc. The substrate may have a thickness in the order of 2 mm with sensing elements on one side and electrical connection leads extended through the substrate to the other side which itself is covered with a electrically grounded surface, except where the leads from the sensor elements emerge. In such circumstances the electrically ground surface will prevent electrically capacitive coupling between the sensor elements 2, 3.

Figure 2:
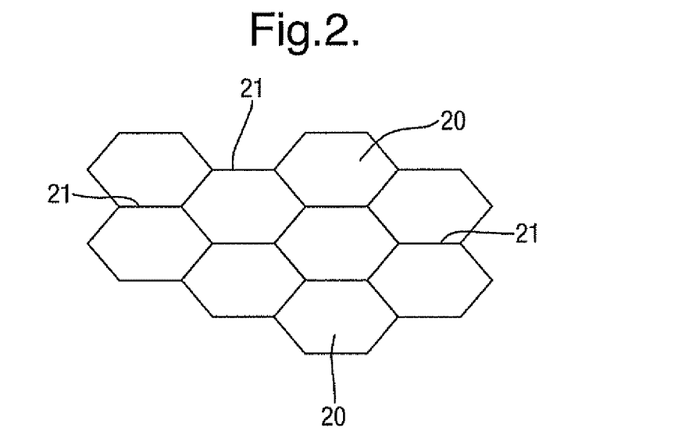
FIG. 2 is a schematic illustration of a cellular structure for a substrate utilised in a sensor in accordance with aspects of the present invention.

An alternative to providing a planar earthing substrate may be to provide a cellular shield as depicted in FIG. 2. In such circumstances each cell 20 incorporates a sensor element in accordance with aspects of the present invention with earthed shields 21 providing the walls of the cells to avoid capacitive coupling between the cells. Each sensor element in the cells 20 are capable of being cross linked in a matrix through differential input charge amplifiers in a similar fashion to that described with regard to FIG. 1. Typically, such a cellular construction would be more conveniently achieved in a large scale integrated circuit (LSIC) array with the necessary electronics connected directly with each sensor in its respective cell or in the sensor array of sensor elements. This arrangement may be similarly miniaturised by producing the charge amplifiers onto a silicon chip and masking or growing the sensing plates onto the surface.

By the above approach as indicated, the decoupling capacitors 6 are provided at the input to the differential input charge amplifier 7. The amplifier circuit also includes capacitors 8, 9 and 10 along with a resistor 13 to provide a charge amplifier function. It will be understood that the purpose of such decoupling devices is to reduce noise and therefore the signal to noise ratio in the differential module system between sensor elements 2, 3. It will be understood that a differential measurement is required to allow the best output signals from the elements 2, 3 to be constructed as an image. Each respective sensor element 2, 3 will provide image signals indicative of their sensor 2, 3 response in terms of electrostatic charge distribution on the object 5 viewed. In such circumstances utilisation of a differential amplifier 7 allows contrast between adjacent and adjoining sensor elements 2, 3 in constructing a display image.

Figure 3:
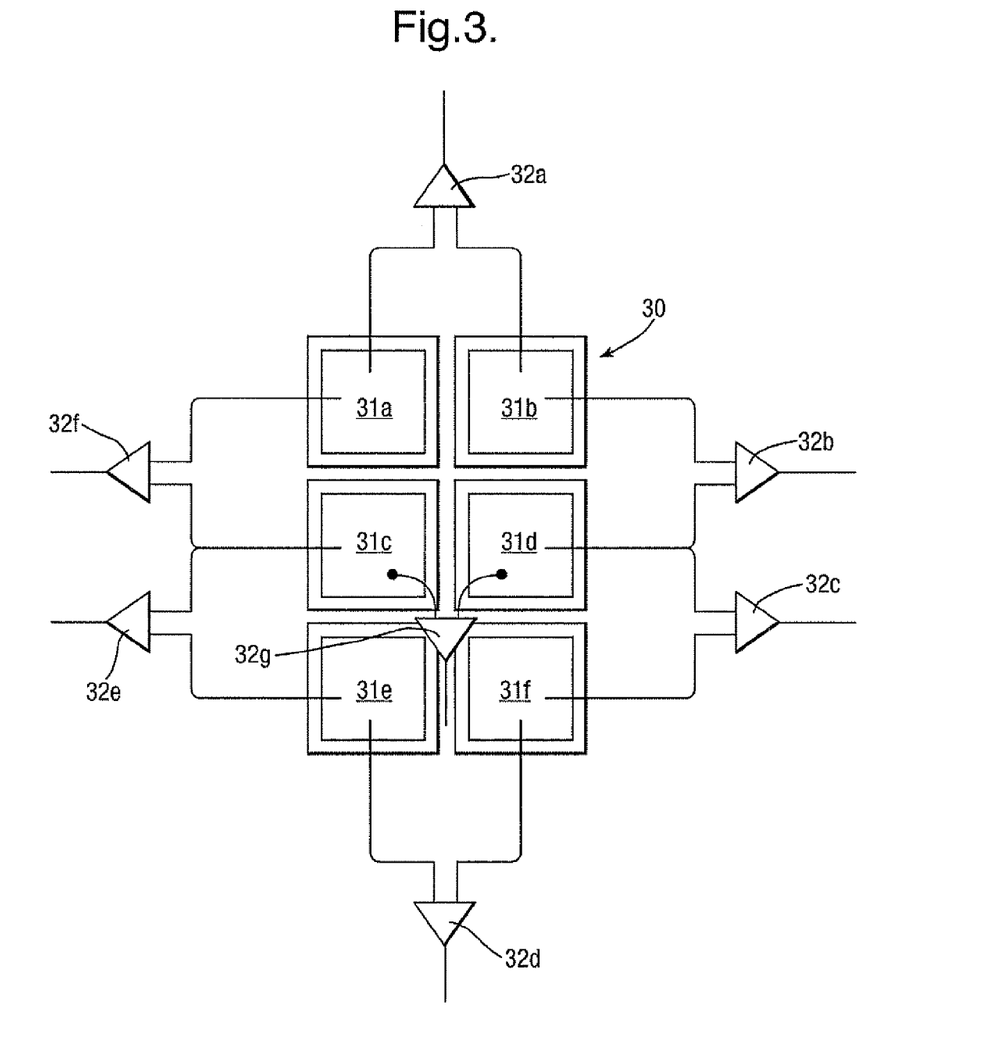
FIG. 3 is a schematic illustration depicting electrostatic sensor elements associated with differential input charge amplifiers in accordance with aspects of the present invention.

FIG. 3 provides a partial illustration in a plan or plane view of a segment 30 of an element 31 sensor array. Thus, as can be seen respective sensor elements 31 are arranged to provide output signals indicative of electrostatic charge. These output signals are sent to respective differential input charge amplifiers 32. The decoupling capacitors are not illustrated with regard to the amplifiers 32. As can be seen by use of the amplifiers 32, differential signals are provided between adjacent or adjoining sensor elements 31 in order to enable with respective signals presented from each amplifier 32, assembly of an appropriate image. The decoupling devices in the form of capacitors or otherwise will limit cross-talk interference and noise between sensors as well as external sources causing problems and degradation in the image formed.

Figure 4:
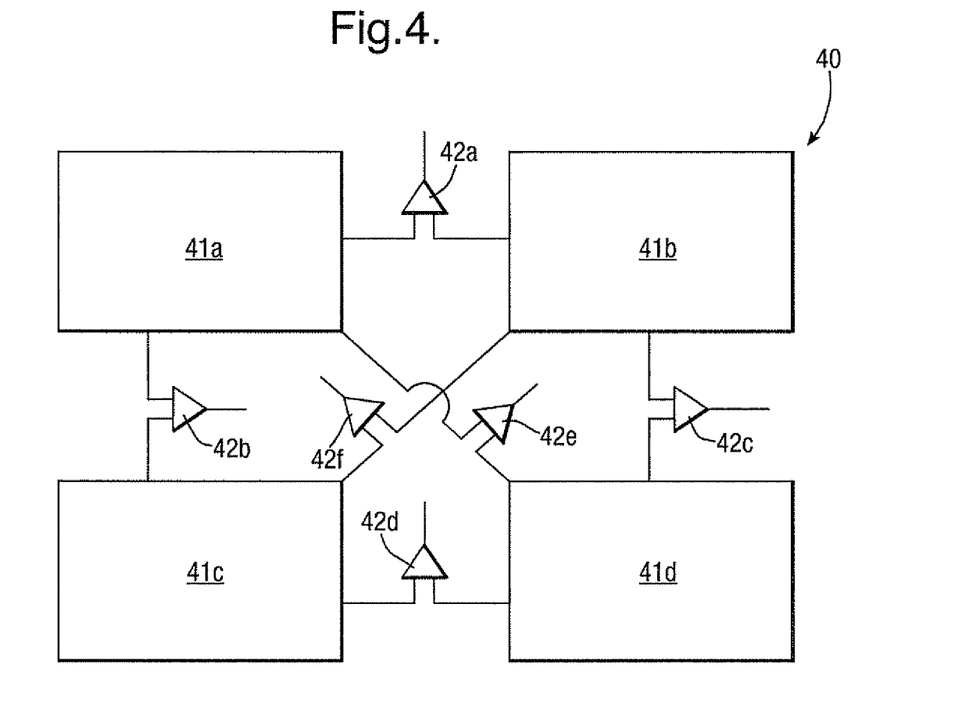
FIG. 4 is a schematic illustration of an alternative electrostatic sensor element array combination in accordance with aspects of the present invention.

It will be understood that the differential input charge amplifiers utilised in accordance with aspects of the present invention in a sensor arrangement allow contrast between adjacent or adjoining sensor elements. Thus, in a four sensor element or pad system as illustrated in FIG. 4 again electrostatic charge sensor elements 41 are provided in an array 40 with differential input charge amplifiers 42 provided between adjacent sensor elements 41. Decoupling devices are not illustrated with respect to the amplifiers 42 but as previously will avoid cross talk and noise between the sensor element 41 and as a result of external interference. In such circumstances the signals provided by the amplifiers 42 will be more reflective of the differentials between the adjacent or adjoining sensor elements 41 and therefore will provide an improvement in the image produced by the sensor arrangement.

Figure 5A:
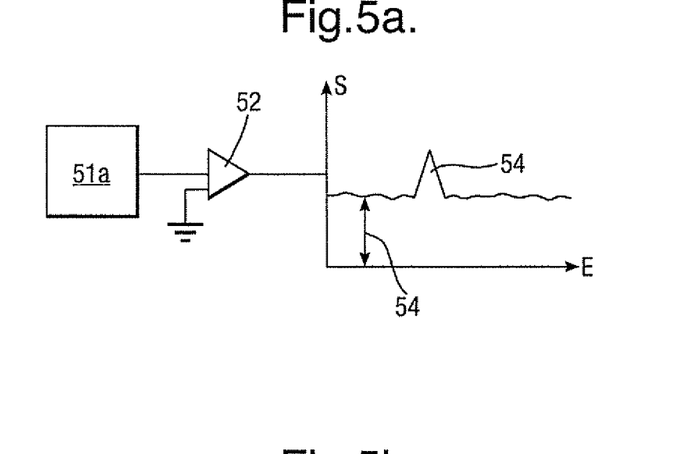
FIG. 5 provides a schematic illustration of image signals taken from adjacent electrostatic sensor elements in accordance with aspects of the present invention.
Figure 5B:
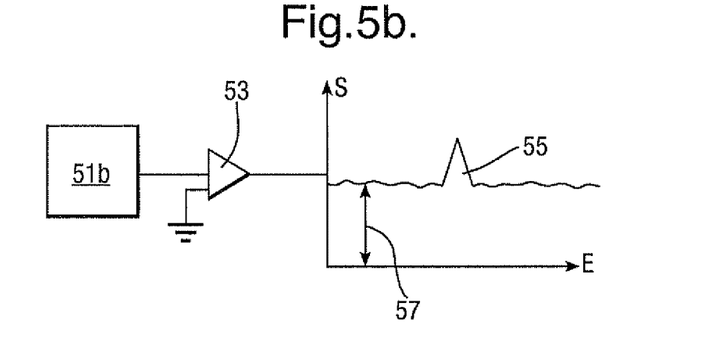

FIG. 5 illustrates output signals from respective electrostatic sensor elements 51 as presented to individual differential input amplifiers 52, 53 in terms of signal against time in a graphic representation depicted in FIG. 5a and FIG. 5b. As can be seen the sensor elements 51 each present one input to the amplifiers 52, 53 whilst the other input is coupled to ground. It will be noted that for illustrative purposes the respective sensor elements 51a, 51b will be considered adjacent or adjoining sensors. In such circumstances the actual signal response from the respective sensors 51 are demonstrated by peaks 54, 55. These peaks 54, 55 are presented with significant background noise illustrated by offsets 56, 57 in the respective graphic depictions. In such circumstances there is significant background noise as typically a charge moves past these sensor elements 51a, 51b.

Figure 5C:
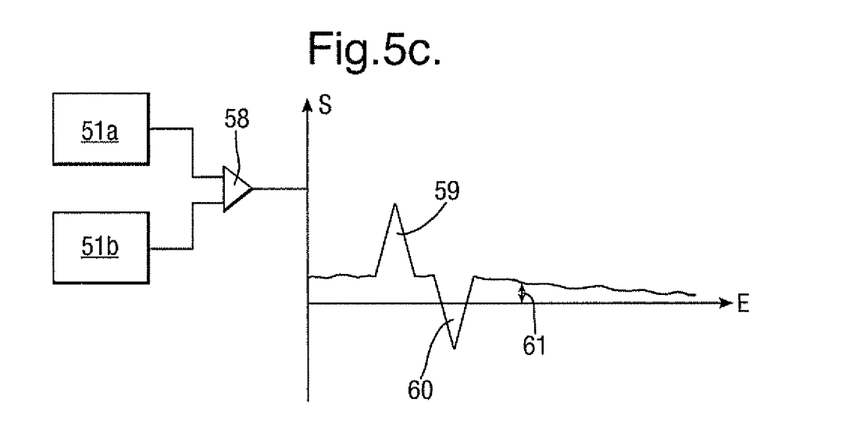

In FIG. 5c a graphical depiction of a sensor arrangement in accordance with aspects of the present invention is provided. Thus the respective electrostatic sensor elements 51a, 51b are now coupled to a differential input amplifier 58 with respective elements 51a, 51b providing inputs to the amplifier 58. In such circumstances a graphic illustration in FIG. 5c shows through the differential measurement process provided by the amplifier and by introducing a decoupling device such as capacitors that as illustrated above there is a reduction in noise. Clearly, it is not possible to eliminate noise completely but as can be seen peaks 59, 60 are still provided as a result of respective outputs from the elements 51a, 51b but the degree of noise offset 61 is reduced. Furthermore it is easier to discriminate the charge passing event and determine its size and width as well as magnitude in terms of the peaks 59, 60 provided in the output from the amplifier 58.

Figure 6:
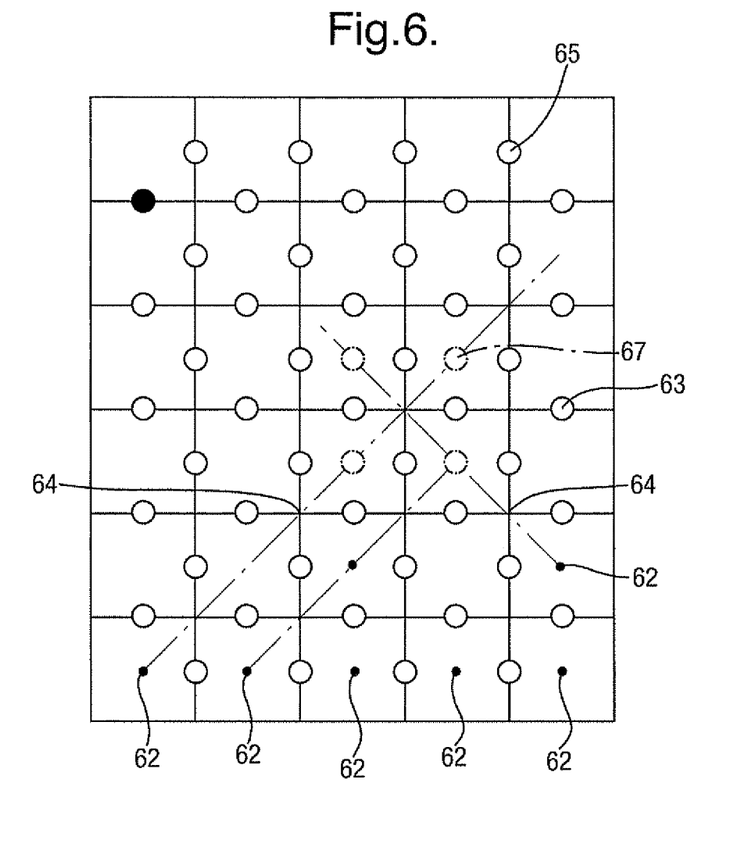
FIG. 6 is a schematic illustration of image points taken from electrostatic sensor elements in accordance with aspects of the present invention.

A further advantage with regard to utilising multiple and differential amplifiers compared to use of a single amplifier as illustrated with respect to European patent number 1055833 is an enhanced number of effective responses and image points in an image created for display. FIG. 6 shows that with respect to a fivexsix sensor element array it is possible to obtain more data points, that is to say forty-nine in comparison with thirty utilising a single amplifier system. Furthermore, including corners, a further forty points are possible enabling enhanced image formation. It will also be understood that typical dither resolution techniques will also be utilised. Such dithering software and processing is used to estimate pixels between measured points based upon a trend-fit and/or smoothing and/or edge detection algorithms.

In FIG. 6 it will be understood that the points 65 in the matrix provide a defined output response from the differential input amplifier between the sensor elements effectively positioned at the center of each square of the matrix 62. By creating or utilising differential amplifiers it will be understood that the respective signal responses with the four adjacent sensors are utilised in order to create the data points 65. As indicated above additionally it may be possible to utilise simple single amplifiers for each actual electrostatic sensor element in order to create further data points at the positions 64. Such an approach may be achieved through providing an operable switch (described earlier) for each of the inputs from the respective electrostatic sensor elements such that they can be switched on and off to create situations wherein for differential input amplifier where both sensors provide input, one sensor provides an input and the other input is grounded and then vice versa where the other sensor element provides an input and the other is grounded to create an input differential determined by the input differential amplifier. Additionally, although adding to wiring and constructional complexity it may be possible to provide further data points 67 through coupling diagonal electrostatic sensor elements with a differential amplifier between them. In such circumstances each electrostatic sensor element may have eight different input differential amplifiers associated with it in order to create data points. Each one of these differential input amplifiers may be arranged as illustrated in a situation where it can operate as a simple amplifier with the other grounded. In such circumstances the respective output signals from a single amplifier may be polled to give an averaged result for individual electrostatic sensor elements.

In the above circumstances it will be appreciated that enhancement of the image created can be utilised for enabling clinicians to examine images during such processes as dermatoscopy where the area to be examined is looked at under a magnifying instrument sometimes with the addition of some enhancing dermatoscopy oil upon the affected area.

In accordance with aspects of the present invention there is provided a decoupled differential input charge amplifier in order to provide an improved image response. These images have significantly lower signal to noise ratios by comparing respective electrostatic generated charge distribution. Furthermore there is improved discrimination when determining charge generation contours utilised in such processes by use of dither analysis and/or edge detection algorithms. It will also be understood by a reduction in noise problems, measurements can be taken at a greater distances from a subject such as a patient. Aspects of the invention combine the decoupled differential input charge amplifier with a sensor element depth to width ratio to reduce noise and cross-talk.

Figure 7:
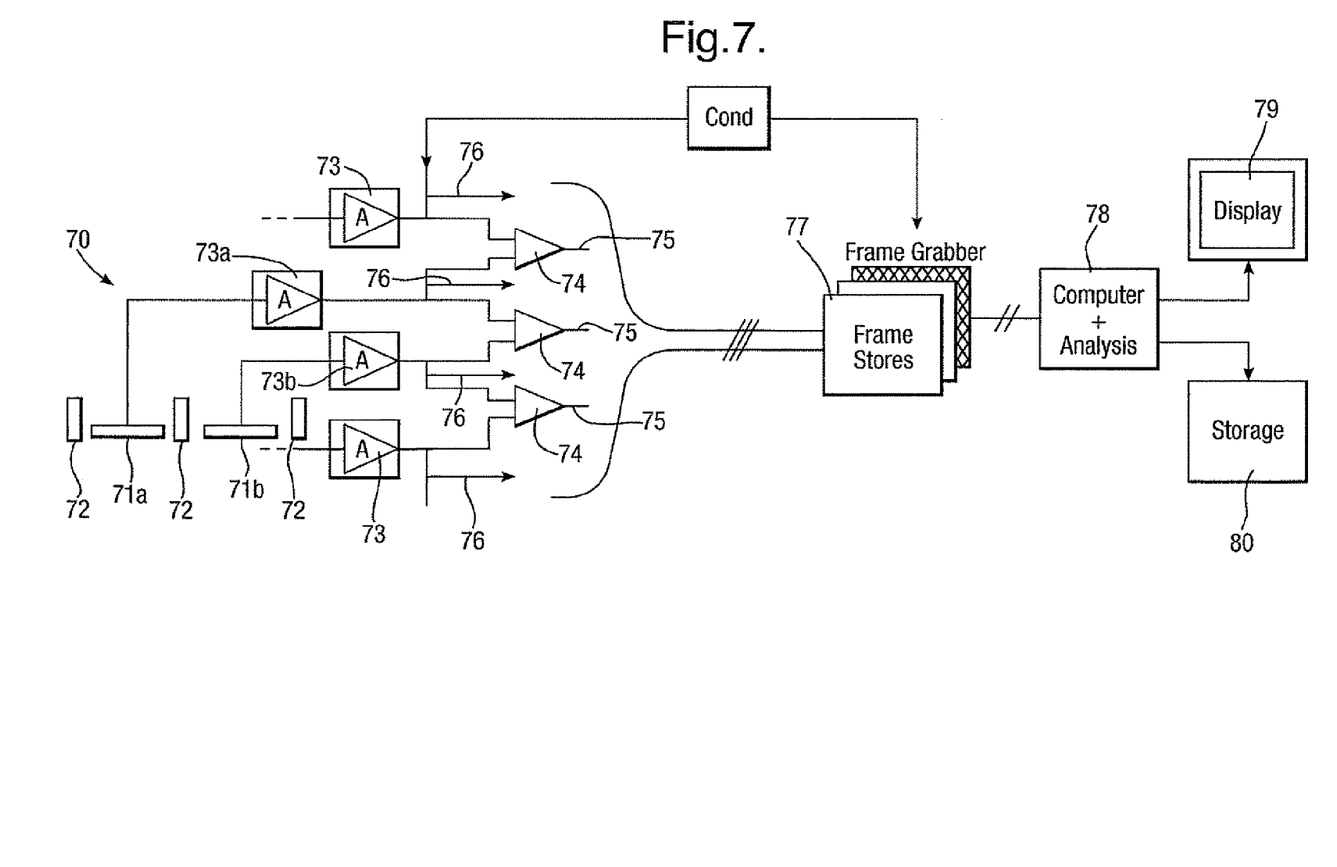
FIG. 7 is a schematic illustration of a first embodiment of a sensor arrangement in accordance with aspects of the present invention.

It will be understood that a sensor arrangement in accordance with aspects of the present invention may incorporate differential input charge amplifiers directly to the sensor elements or as illustrated in FIG. 7 the differential input amplifiers may be associated with the outputs from a single amplifier associated with each respective sensor element. Thus, as illustrated in FIG. 7 a sensor array 70 comprises a plurality of sensor elements 71 having electrical screening 72 between them and with each sensor element 71 associated with its own single amplifier 73. In such circumstances respective signals from the sensor elements 71 are provided by each amplifier 73. In accordance with aspects of the present invention the outputs from the amplifier 73 are input to differential input charge amplifiers 74. The amplifiers 74 provide output signals 75, which can be combined with signals 76 from the single amplifiers 73 to form images in frame stores or frame grabbers 77 which in turn can allow computational analysis 78 as well as display of images 79 and storage of those images 80. By such refinements it is possible to measure both absolute and relative values between the sensors 71 in order to improve images and displayed images as required. Such improvements will provide a more accurate map of larger areas of charge generation and will allow measurement of varying levels of charge moving slowly across an area.

Figure 8:
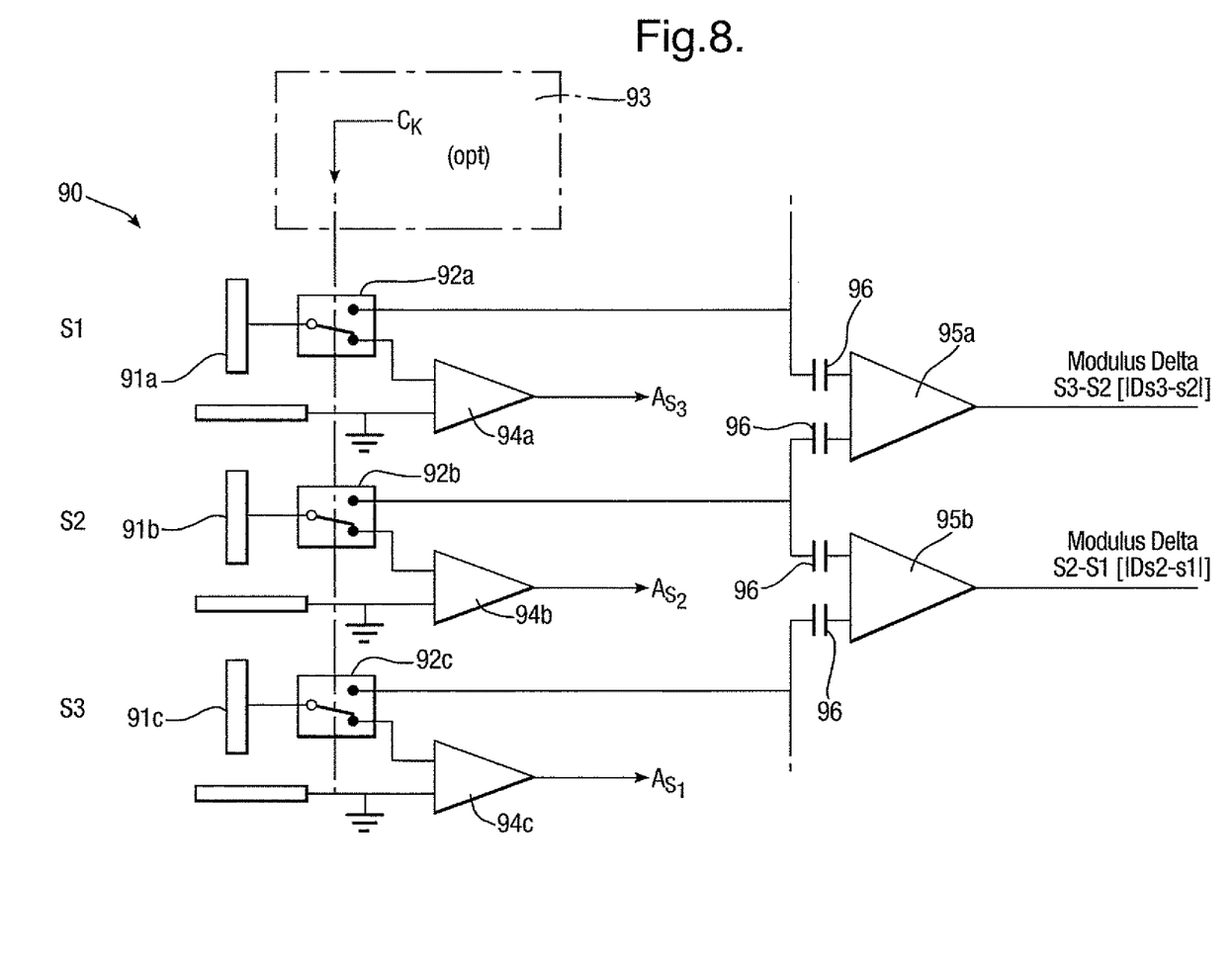
FIG. 8 is a schematic illustration of a second embodiment of a sensor arrangement in accordance with aspects of the present invention.

As indicated previously the arrangement as depicted in FIG. 7 may be substantially hard wired in the sense that the signal outputs 75, 76 are fixed and associated with an appropriate multiplexer device in order to create the images through the frame store 77 and computer analysis 78. Alternatively as depicted in FIG. 8 an array 90 comprises of a plurality of electrostatic sensor elements 91 in an appropriate sensor array. Bach sensor element 91 is associated with a switch 92. The switch 92 may be controlled by a clock 93 such that dependent, upon the switch 92 condition, output signals from the sensor elements 91 are provided to a single amplifier 94 for each sensor element or a differential input amplifier 95 with appropriate decoupling devices such as capacitors 96. In such circumstances in a single amplifier 94 mode it will be understood that the output signal from the respective sensor element 91 is provided as one input to the amplifier 94 whilst the other input to the amplifier is electrically grounded. In such circumstances the single amplifier 94 will provide an output signal As for utilisation in forming an image. In a second switch state or position as indicated respective sensor elements 91 present inputs to the differential input amplifiers 95 in order to provide output signals Ds representing the differentials between respective sensor elements 91. These output signals As and Ds can then be utilised in forming an image.

The clock 93 essentially controls operation of the array 90 in order to create the image and will generally allow only one frame to be stored at any one time from the respective output signals As, Ds. It will be understood that the switches 92 will not be of a mechanical nature as this would introduce electrical noise into the system and therefore typically semi-conductor and electronic switches such as MOSFET switches will be utilised.

Figure 9:
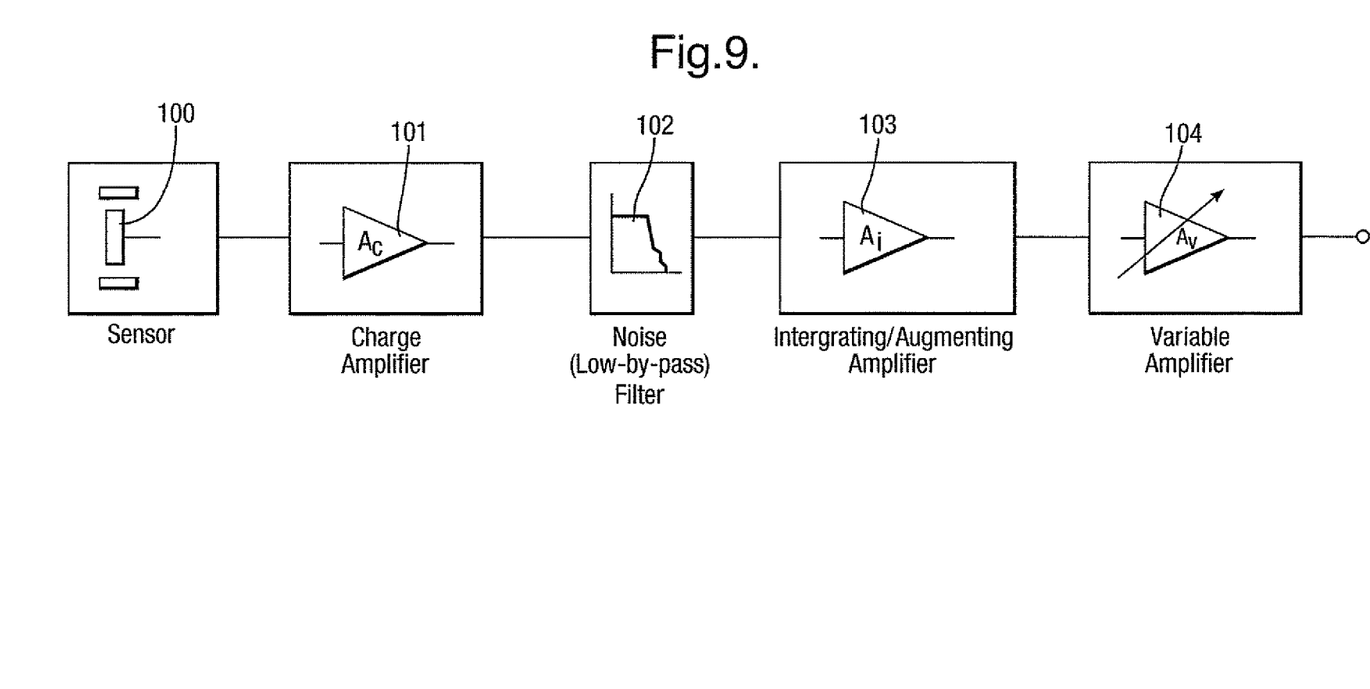
FIG. 9 is a schematic illustration of a cascade of amplifiers utilised in accordance with a sensor arrangement in accordance with aspects of the present invention.

It will be understood that, as illustrated above, other facilities and processing can be achieved in accordance with aspects of the present invention. In such circumstances sensor signal conditioning can occur utilising a charge amplifier feeding an integrating or augmenting amplifier. A variable amplifier is used to auto-scale the output and is electronically ganged or coupled to other amplifiers. The calibration setting applies an offset via the amplifier. The augmenting amplifier is the preferred approach as the charge can be integrated over time, which helps with low signal levels and can average out systemic noise. FIG. 9 provides a generic schematic illustration of such a signal conditioning approach. In such circumstances a sensor 100 of an array of sensors in accordance with aspects of the present invention provides an output signal to a charge amplifier 101 that provides an output signal to a noise filter 102 with an output from that filter 102 presented to an integrating/augmenting amplifier 103 and an (optional) variable amplifier 104. By such an approach and in accordance with aspects of the present invention, there is a combination of absolute differential measurement of an array of electrostatic sensor elements. By utilisation of the differential input amplifier in accordance with aspects of the present invention there is imposition of respective output signals from adjacent or adjoining sensor elements to give a noise reduced signal such that the edges of images are better defined.

It is possible that by incorporating a frame transfer CCD array and with the addition of an electrostatic lens or field scanner a reduction in the sensor arrangement size can be achieved. However, with use of a charge coupled device (CCD array) it will be necessary to provide shielding to prevent photoinitiation of the output pulses so as to measure as much as possible only direct charge transfer. Alternatively, selective filtering can be used to compensate for photon (light) incidence.

As indicated above aspects of the present invention are utilised with respect to electrostatic charge determinations. In such circumstances images can be useful with regard to inspecting surface features upon a patient's skin or alternatively points of friction or thermal imaging such as with regard to bearing wear. In such circumstances aspects of the present invention may be combined with a thermal imaging camera or a visual imaging camera.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:
1. A sensor comprising:
   an array of electrostatic sensor elements,
   each sensor element capable of producing a respective output signal when the sensor is directed to a region of an object being sensed,
   the output signals being separately available at the sensor output to provide information relating to the electrostatic charge distribution across the region,
   the sensor characterised in that at least two electrostatic sensor element are interlinked by means of a differential input charge amplifier, and each input to the differential input charge amplifier includes a decoupling device,
   wherein the differential input charge amplifier is associated with an integrating or augmenting amplifier to further condition the image signal presented to the controller.
2. A sensor as claimed in claim 1 wherein the decoupling device is a capacitor or resistor-capacitor divider or inductive-capacitor divider.

3. A sensor as claimed in claim 1 wherein the decoupling device is a high voltage capacity and be electrically stable.

4. A sensor as claimed in claim 2 wherein the decoupling device is a capacitor having a value in the range of 1 pF to 1 µF.

5. A sensor as claimed in claim 1 wherein the specification of the decoupling device is determined at least in part by the relative position of the sensor to the differential input charge amplifier.

6. A sensor as claimed in claim 1 wherein the value of the decoupling device is determined by trace inductance and signal frequency of the respective electrostatic sensor elements in the sensor.

7. A sensor as claimed in claim 1 wherein the at least one electrostatic sensor element has a depth to surface width ratio of about (d:w) 1:>10.

8. A sensor as claimed in claim 1 wherein each electrostatic sensor element is presented upon a substrate formed from glass reinforced plastic (GRP) to prevent capacitive coupling between sensor elements in the array.

9. A sensor as claimed in claim 8 wherein the one electrostatic sensor element is presented on one side of the substrate and electrical connections pass through the substrate to the other side, the other side has an electrically grounded surface to prevent capacitive coupling.

10. A sensor as claimed in claim 1 wherein the substrate has a cellular construction with each electrostatic sensor element in a cell and an electrically grounded shield provided between each adjacent cell to inhibit electrical coupling.

11. A sensor arrangement comprising a sensor as claimed in claim 1, a display and a controller, the sensor providing image signals to the controller for each electrostatic sensor element, the controller consolidating the image signals to provide a display signal to the display.

12. An arrangement as claimed in claim 11 wherein the controller incorporates a means for dither manipulation of the image signals providing estimation for pixels between electrostatic sensor element positions and so by a trend fit and/or smoothing technique enhance a display signal presented to the display.

13. An arrangement as claimed in claim 11 wherein the sensor arrangement incorporates a switch for the one electrostatic sensor element to allow the differential input charge amplifier to be switched into association with the sensor electively.

14. An arrangement as claimed in claim 13 wherein the switch allows the one electrostatic sensor element to be switched between the differential input charge amplifier and the decoupling device and another amplifier.

15. An arrangement as claimed in claim 13 wherein the switch is operated by a timing device associated within the controller to switch operation of the electrostatic sensor element dependent upon provision of a necessary display signal to the display.

16. An arrangement as claimed in claim 11 wherein the differential input charge amplifier is associated with an integrating or augmenting amplifier to further condition the image signal presented to the controller.

17. An arrangement as claimed in claim 11 wherein the sensor arrangement incorporates a cascade of amplifiers and/or signal filters after the differential input charge amplifier in order to condition and present the image signal to the controller.

* * * * *